(12) United States Patent
Joo et al.

(10) Patent No.: US 11,424,296 B2
(45) Date of Patent: Aug. 23, 2022

(54) DISPLAY PANEL AND METHOD OF MANUFACTURING THE SAME

(71) Applicant: Samsung Display Co., Ltd., Yongin-si (KR)

(72) Inventors: Sun-kyu Joo, Suwon-si (KR); Keunchan Oh, Hwaseong-si (KR); Byung-Chul Kim, Suwon-si (KR); Inok Kim, Osan-si (KR); Jaemin Seong, Suwon-si (KR); Gakseok Lee, Hwaseong-si (KR); Jieun Jang, Suwon-si (KR); Inseok Song, Pocheon-si (KR); Chang-Soon Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/179,773

(22) Filed: Feb. 19, 2021

(65) Prior Publication Data

US 2021/0175291 A1 Jun. 10, 2021

Related U.S. Application Data

(63) Continuation of application No. 16/776,355, filed on Jan. 29, 2020, now Pat. No. 10,950,667.

(30) Foreign Application Priority Data

Mar. 18, 2019 (KR) .................. 10-2019-0030746

(51) Int. Cl.
*H01L 27/32* (2006.01)
*H01L 51/52* (2006.01)

(52) U.S. Cl.
CPC .......... *H01L 27/322* (2013.01); *H01L 27/326* (2013.01); *H01L 27/3246* (2013.01);
(Continued)

(58) Field of Classification Search
CPC . H01L 27/322; H01L 27/3246; H01L 27/326; H01L 27/3276; H01L 27/3288;
(Continued)

(56) References Cited

U.S. PATENT DOCUMENTS 10,048,530 B1   8/2018 Kim et al.
2011/0084290 A1* 4/2011 Nakamura .......... H01L 51/5246
                                                      257/89

(Continued)

FOREIGN PATENT DOCUMENTS

EP   3435149      1/2019
JP   2015050096   3/2015
(Continued)

OTHER PUBLICATIONS

Notice of Allowance dated Nov. 4, 2020, in U.S. Appl. No. 16/776,355.

(Continued)

*Primary Examiner* — Dao H Nguyen
(74) *Attorney, Agent, or Firm* — H.C. Park & Associates, PLC

(57) ABSTRACT

A display panel includes: an upper display substrate including a plurality of pixel areas arranged in each of a plurality of pixel columns and a light blocking area disposed adjacent to the pixel areas; and a lower display substrate including a plurality of display elements respectively overlapping the pixel areas, wherein the upper display substrate includes: a base substrate; a color filter layer disposed on the base substrate; and a light control layer disposed on the color filter layer and including transmission portions respectively at least partially overlapping first pixel areas arranged in a first one of the pixel columns and first conversion portions respectively at least partially overlapping second pixel areas arranged in a second one of the pixel columns, wherein the light blocking area includes a first light blocking area defined between the transmission portion and the first conversion portion, and a second light blocking area defined between the first conversion portions, and a first shortest distance from the base substrate to a lower surface of a first portion of the light control layer overlapping the first light blocking area is substantially equal to a second shortest distance from the base substrate to a lower surface of a
(Continued)

second portion of the light control layer overlapping the second light blocking area.

7 Claims, 16 Drawing Sheets

(52) U.S. Cl.
CPC ...... *H01L 27/3276* (2013.01); *H01L 27/3288* (2013.01); *H01L 51/5268* (2013.01)

(58) Field of Classification Search
CPC ............. H01L 27/3206; H01L 27/3272; H01L 27/3211; H01L 51/5268; H01L 51/5262; H01L 51/5281; H01L 51/5284
USPC .......................................................... 257/40
See application file for complete search history.

(56) References Cited

U.S. PATENT DOCUMENTS

| 2011/0089412 | A1* | 4/2011 | Fujimori | H01L 51/0013 |
| | | | | 257/E51.027 |
| 2012/0032151 | A1* | 2/2012 | Hama | C09K 11/06 |
| | | | | 252/586 |
| 2015/0069362 | A1 | 3/2015 | Ito | |
| 2017/0062535 | A1 | 3/2017 | Kim et al. | |
| 2017/0287984 | A1 | 10/2017 | Koresawa | |
| 2017/0315389 | A1* | 11/2017 | Chu | G02F 1/133514 |
| 2017/0338432 | A1 | 11/2017 | Admovich et al. | |
| 2018/0006093 | A1 | 1/2018 | Kim et al. | |
| 2019/0025634 | A1 | 1/2019 | Park et al. | |
| 2019/0212610 | A1 | 7/2019 | Kim et al. | |
| 2019/0245120 | A1 | 8/2019 | Choi et al. | |
| 2019/0363146 | A1* | 11/2019 | Takahashi | H01L 51/5243 |
| 2020/0152919 | A1 | 5/2020 | Joo et al. | |

FOREIGN PATENT DOCUMENTS

| KR | 10-2018-0028822 | 3/2018 |
| KR | 10-2018-0092326 | 8/2018 |
| KR | 10-2020-0054382 | 5/2020 |

OTHER PUBLICATIONS

Extended European Search Report dated Jul. 13, 2020, issued in EP Patent Application No. 20163035.7.

* cited by examiner

DISPLAY PANEL AND METHOD OF MANUFACTURING THE SAME

CROSS-REFERENCE TO RELATED APPLICATIONS

This application is a continuation of U.S. patent application Ser. No. 16/776,355, filed on Jan. 29, 2020, and claims priority from and the benefit of Korean Patent Application No. 10-2019-0030746, filed on Mar. 18, 2019, which is incorporated by reference for all purposes as if fully set forth herein.

BACKGROUND

Field

Exemplary implementations of the invention relate generally to display panels and, more specifically, to a display panel capable of preventing color mixture between pixels and a method of manufacturing the display panel.

Discussion of the Background

Various display devices, which are applied to multimedia devices, such as televisions, mobile phones, tablet computers, navigation devices, and game devices, are being developed. The display devices include a variety of display panels. For example, a transmission-type display panel that selectively transmits a source light generated by a light source or a light emission-type display panel that generates the source light by itself is used as the display panel. The display panels include pixels that emit light of different colors, such as red, green and blue. The above information disclosed in this Background section is only for understanding of the background of the inventive concepts, and, therefore, it may contain information that does not constitute prior art.

SUMMARY

Applicant discovered that in display devices having pixels with barriers of different heights, the colors emitted from the pixels may be mixed between the pixel areas.

Display panels constructed according to exemplary implementations of the invention and methods of manufacturing the same according to the exemplary embodiments of the invention are capable of preventing color mixture between pixel areas and improving visibility of the display by controlling the height of barriers and sub-barriers disposed between the pixel areas. For example, the lower surface of the barrier and the lower surface of the sub-barrier may be disposed at substantially the same height. More specifically, in one exemplary embodiment, the shortest distance from a upper substrate to a lower surface of the barrier overlapping a light transmission portion and a light conversion portion of the display may be equal to the distance from the upper substrate to a lower surface of a sub-barrier overlapping the conversion portions. Therefore, color mixture between the pixel areas may be more efficiently prevented and the overall visibility of the display panel may be improved.

Additional features of the inventive concepts will be set forth in the description which follows, and in part will be apparent from the description, or may be learned by practice of the inventive concepts.

According to an aspect of the invention, a display panel includes: an upper display substrate including a plurality of pixel areas arranged in each of a plurality of pixel columns and a light blocking area disposed adjacent to the pixel areas and a lower display substrate including a plurality of display elements respectively overlapping the pixel areas. The upper display substrate includes a base substrate, a color filter layer having first and second opposed surfaces, with the first surface being disposed on the base substrate, a light control layer disposed on the color filter layer and including transmission portions respectively overlapping first pixel areas arranged in a first one of the pixel columns and first conversion portions respectively overlapping second pixel areas arranged in a second one of the pixel columns, and a barrier layer overlapping the light blocking area, disposed on the color filter layer, and including first barriers disposed between the first conversion portions and the transmission portions and first sub-barriers disposed between adjacent first conversion portions. A first shortest distance from the base substrate to a lower surface of each of the first barriers facing the lower display substrate is equal to a second shortest distance from the base substrate to a lower surface of each of the first sub-barriers facing the lower display substrate.

Each of the first sub-barriers may include a barrier portion disposed on the color filter layer and a cover portion covering the barrier portion and connected to the first conversion portions, and the lower surface of the first sub-barriers may include a lower surface of the cover portion.

The cover portion may have an integral shape with the first conversion portions.

The first conversion portions may convert a first color light emitted from the display elements to a second color light, the transmission portions transmit the first color light, and the barrier portion and the transmission portions may include substantially the same material.

The barrier portion may include scattering particles and may be transparent.

The first barriers may have a color having a wavelength range different from the first color light.

At least a portion of each of the first barriers may protrude from the light control layer, and a height of the portion of each of the first barriers may be substantially equal to a height of the cover portion.

The light control layer may further include second conversion portions respectively overlapping third pixel areas arranged in a third one of the pixel columns, the barrier layer further may include second sub-barriers disposed between the second conversion portions, and a shortest distance from the base substrate to a lower surface of each of the second sub-barriers facing the lower display substrate may be substantially equal to the second shortest distance.

The barrier layer may further include third sub-barriers disposed between the transmission portions, and a shortest distance from the base substrate to a lower surface of each of the third sub-barriers facing the lower display substrate may be shorter than the second shortest distance.

The third sub-barriers may have an integral shape with the transmission portion.

At least a portion of each of the first barriers may protrude from the light control layer to face the lower display substrate, and at least a portion of each of the first sub-barriers may protrude from the light control layer to face the lower display substrate.

A height of the portion of each of the first barriers may be substantially equal to a height of the portion of each of the first sub-barriers.

An area of the portion of each of the first barriers may be larger than an area of the portion of each of the first sub-barriers.

According to another aspect of the invention, a display panel includes: an upper display substrate including a plurality of pixel areas and a light blocking area disposed adjacent to the pixel areas and a lower display substrate including a plurality of light emitting devices respectively overlapping the pixel areas. The upper display substrate includes a base substrate, a color filter layer disposed on the base substrate, a light control layer disposed on the color filter layer and including a transmission part including transmission portions respectively overlapping first pixel areas arranged in one pixel column and first light blocking portions overlapping the light blocking area and disposed between the transmission portions and a first conversion part including first conversion portions respectively overlapping pixel areas arranged in another pixel column and second light blocking portions overlapping the light blocking area and disposed between the first conversion portions, and a barrier layer extending the light blocking area and including first barriers disposed between the first conversion part and the transmission part and disposed on the color filter layer and first sub-barriers disposed on the second light blocking portions of the first conversion part. At least a portion of each of the first barriers protrudes from the light control layer to face the lower display substrate, and a height of the first barriers is substantially equal to a height of the sub-barriers.

The first conversion portions may convert a first color light emitted from the light emitting devices to a second color light, the transmission portions transmit the first color light, and the first sub-barriers may have a color with a wavelength range different from that of the first color light.

The transmission portions may have an integral shape with the first light blocking portions, and the first conversion portions may have an integral shapewith the second light blocking portions.

The first barriers and the first sub-barriers may have substantially the same color.

According to still another aspect of the invention, a method of manufacturing a display panel includes the steps of: disposing a color filter layer on a base substrate in which a plurality of pixel areas and a light blocking area adjacent to the pixel areas are formed, substantially simultaneously forming sub-barriers overlapping a first light blocking area of the light blocking area, which is disposed between the pixel areas arranged in one pixel column, and transmission portions overlapping the pixel areas arranged in another pixel column and transmitting a first color light exiting from a lower display substrate on the color filter layer, forming a first conversion portion converting the first color light exiting from the lower display substrate to a second color light and overlapping the pixel areas arranged in the one pixel column, determining a height from a lower surface of the first conversion portion that does not overlap with the sub-barriers to a lower surface of the first conversion portion that overlap with the sub-barriers, and forming barriers overlapping a second light blocking area of the light blocking area, which is disposed between the transmission portion and the first conversion portion, on the color filter layer to a height based on the determined height.

The transmission portions and the sub-barriers may include scattering particles formed of substantially the same material.

A lower surface of each of the sub-barriers overlapping the first light blocking area and a lower surface of each of the barriers overlapping the second light blocking area may have the substantially same height from the base substrate.

According to still yet another aspect of the invention, a display panel includes: an upper display substrate including a plurality of pixel areas arranged in each of a plurality of pixel columns and a light blocking area disposed adjacent to the pixel areas; and a lower display substrate including a plurality of display elements respectively overlapping the pixel areas. The upper display substrate includes: a base substrate; a color filter layer disposed on the base substrate; and a light control layer disposed on the color filter layer and including transmission portions respectively at least partially overlapping first pixel areas arranged in a first one of the pixel columns and first conversion portions respectively at least partially overlapping second pixel areas arranged in a second one of the pixel columns. The light blocking area includes a first light blocking area defined between the transmission portion and the first conversion portion, and a second light blocking area defined between the first conversion portions. A first shortest distance from the base substrate to a lower surface of a first portion of the light control layer overlapping the first light blocking area is substantially equal to a second shortest distance from the base substrate to a lower surface of a second portion of the light control layer overlapping the second light blocking area.

At least one of the first portion and the second portion, and the transmission portions may include substantially the same material.

At least one of the first portion and the second portion may include scattering particles and may be transparent.

The light control layer may further include second conversion portions respectively at least partially overlapping third pixel areas arranged in a third one of the pixel columns.

The light blocking area may further include a third light blocking area defined between the first conversion portion and the second conversion portion, and a shortest distance from the base substrate to a lower surface of a third portion of the light control layer overlapping the third light blocking area is substantially equal to the second shortest distance.

The light blocking area may further include a fourth light blocking area defined between the transmission portions, and a shortest distance from the base substrate to a lower surface of a fourth portion of the light control layer overlapping the fourth light blocking area is shorter than the second shortest distance.

According to yet still another aspect of the invention, a display panel includes: a base substrate including a plurality of pixel areas arranged in each of a plurality of pixel columns and a light blocking area disposed adjacent to the pixel areas; a plurality of display elements respectively overlapping the pixel areas; a light control layer disposed on the plurality of display elements and including transmission portions respectively at least partially overlapping first pixel areas arranged in a first one of the pixel columns and first conversion portions respectively at least partially overlapping second pixel areas arranged in a second one of the pixel columns; and a color filter layer disposed on the light control layer. The light blocking area includes a first light blocking area defined between the transmission portion and the first conversion portion, and a second light blocking area defined between the first conversion portions. A thickness of a first portion of the light control layer overlapping the first light blocking area may be substantially equal to a thickness of a second portion of the light control layer overlapping the second light blocking area, and a thickness of a first color filter portion of the color filter layer overlapping the first light blocking area is substantially equal to a thickness of a second color filter portion of the color filter layer overlapping the second light blocking area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
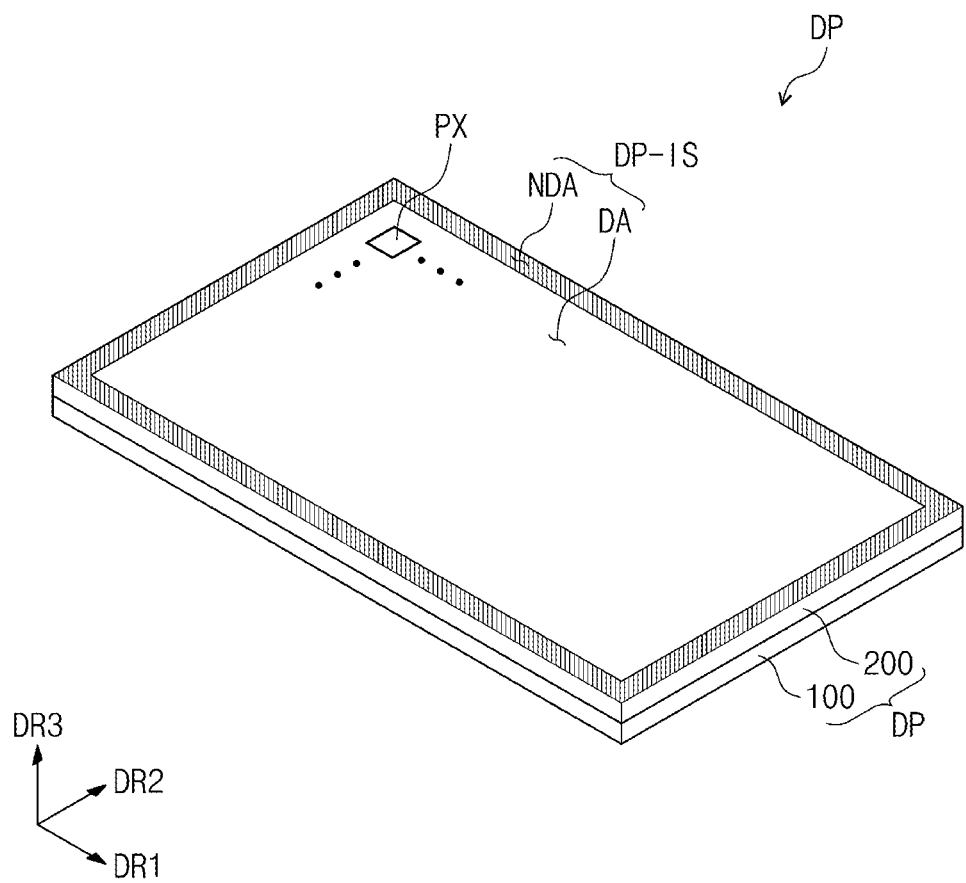
FIG. 1A is a perspective view of an exemplary embodiment of a display panel constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
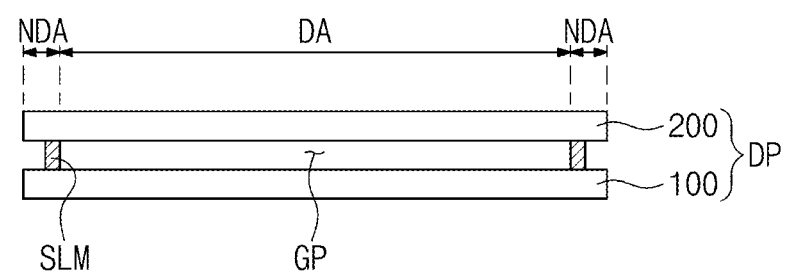
FIG. 1B is a cross-sectional view of an exemplary embodiment of a display panel constructed according to the principles of the invention.
Figure 1B:
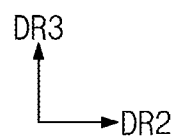

FIG. 1A is a perspective view of an exemplary embodiment of a display panel DP constructed according to the principles of the invention. FIG. 1B is a cross-sectional view of an exemplary embodiment of the display panel DP constructed according to the principles of the invention The display panel DP may be applied to a large-sized electronic item, such as a monitor or an outdoor billboard, and a small and medium-sized electronic item, such as a personal computer, a notebook computer, a personal digital assistants, a car navigation unit, a game unit, a smartphone, a tablet computer, or a camera. These are merely exemplary, and the display panel DP may be applied to other electronic items as well.

According to an exemplary embodiment, the display panel DP may be one of a liquid crystal display panel, an electrophoretic display panel, a microelectromechanical system display panel, an electrowetting display panel, and an organic light emitting display panel, however, the specific type of panel is not particularly limited.

The display panel DP may further include a chassis member or a molding member and may further include a backlight unit according to the type of the display panel DP.

Referring to FIG. 1A, the display panel DP may include a lower display substrate 100 and an upper display substrate 200 spaced apart from and opposing the lower display substrate 100. As shown in FIG. 1A, the display panel DP may display an image through a display surface DP-IS. The display surface DP-IS may be substantially parallel to a plane defined by a first direction DR1 and a second direction DR2.

The display surface DP-IS may include a display area DA and a non-display area NDA. Pixels PX are arranged in the display area DA and not arranged in the non-display area NDA. The non-display area NDA is defined along an edge of the display surface DP-IS. The display area DA may be surrounded by the non-display area NDA.

A third direction DR3 indicates a normal line direction of the display surface DP-IS, i.e., a thickness direction of the display panel DP. In the following descriptions, the expressions "when viewed in a plan view" or "in a plan view" mean the case of being viewed in the third direction DR3. Hereinafter, front (or upper) and rear (or lower) surfaces of each layer or each unit are distinct from each other by being spaced apart in the third direction DR3, as shown best in FIG. 1B. However, directions indicated by the first, second, and third directions DR1, DR2, and DR3 are relative to each other, and thus the directions indicated by the first, second, and third directions DR1, DR2, and DR3 may be changed to other directions, e.g., opposite directions.

The display panel DP includes a flat type display surface DP-IS, however, the display panel DP is not limited thereto or thereby. For example, the display panel DP may include a curved type display surface or a three-dimensional type display surface. The three-dimensional type display surface may include a plurality of display areas extending in different directions from each other.

Referring to FIG. 1B, a predetermined cell gap GP may be defined between the upper display substrate 200 and the lower display substrate 100. The cell gap GP may be maintained by a sealant SLM used to couple the upper display substrate 200 and the lower display substrate 100. The sealant SLM may include an organic adhesive member or an inorganic adhesive member. The sealant SLM may include a frit.

Figure 2:
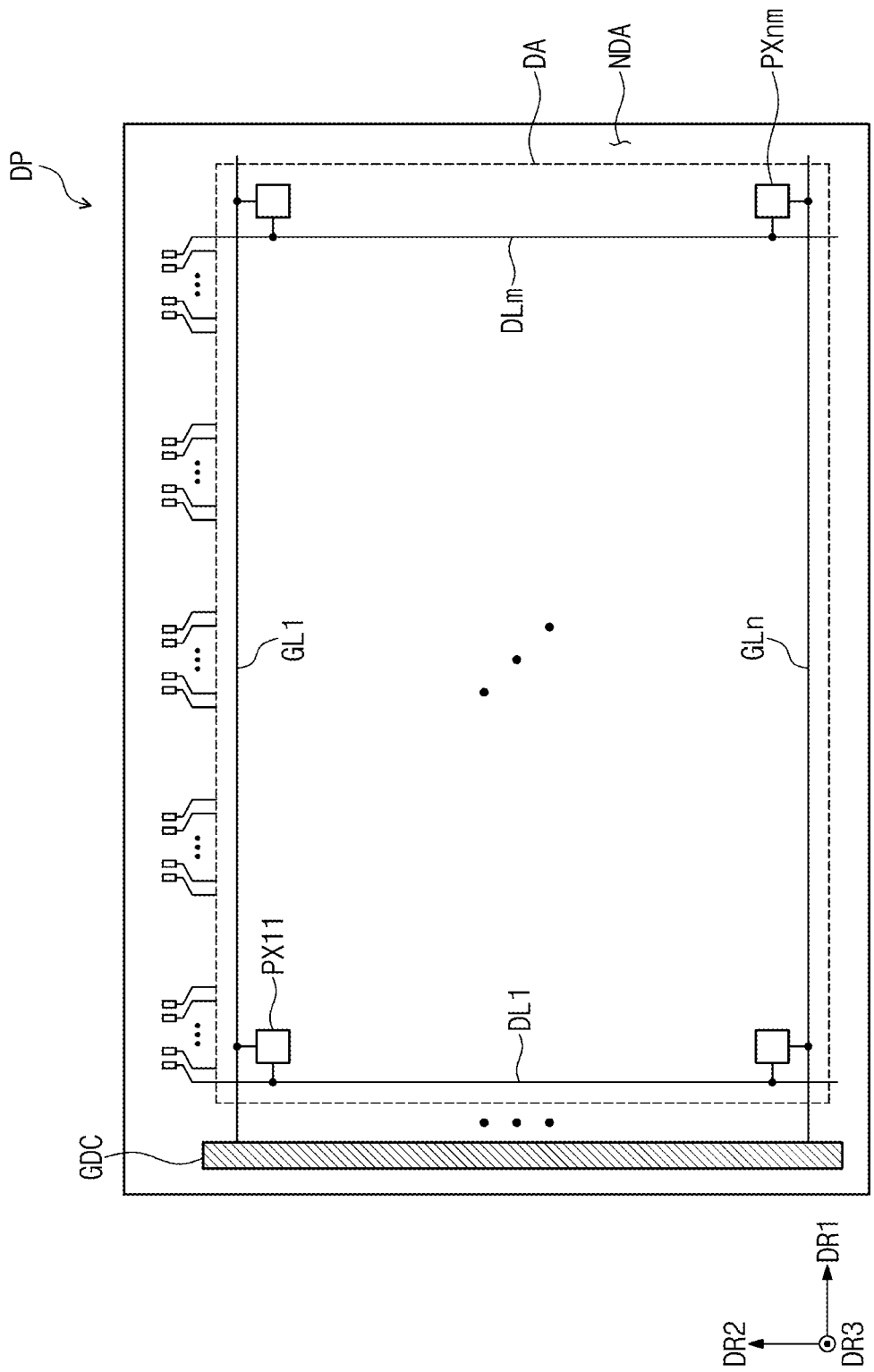
FIG. 2 is a plan view of an exemplary embodiment of a display panel constructed according to the principles of the invention.
Figure 3:
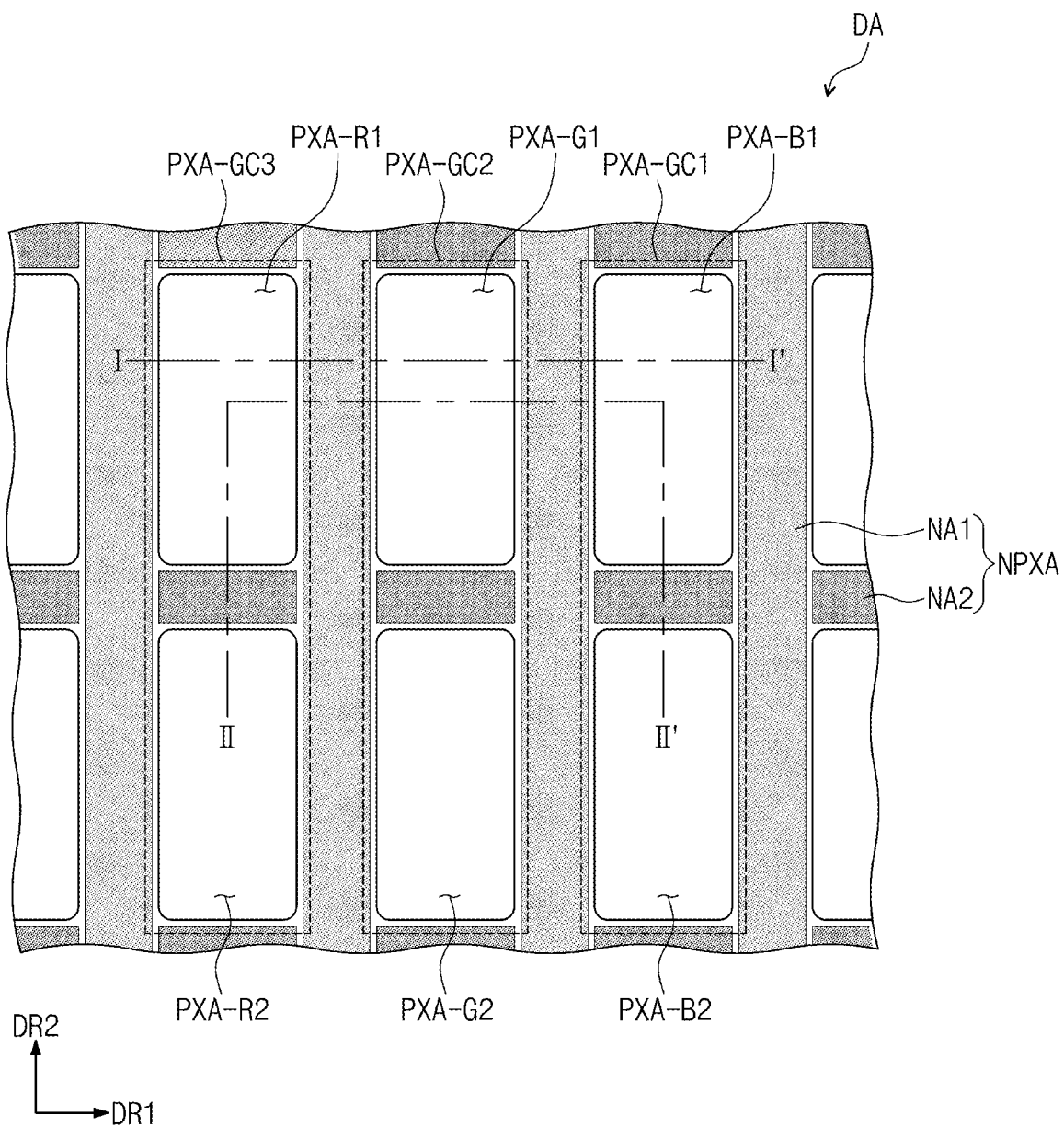
FIG. 3 is a plan view of an exemplary embodiment of representative pixel areas of a display panel constructed according to the principles of the invention.
Figure 4:
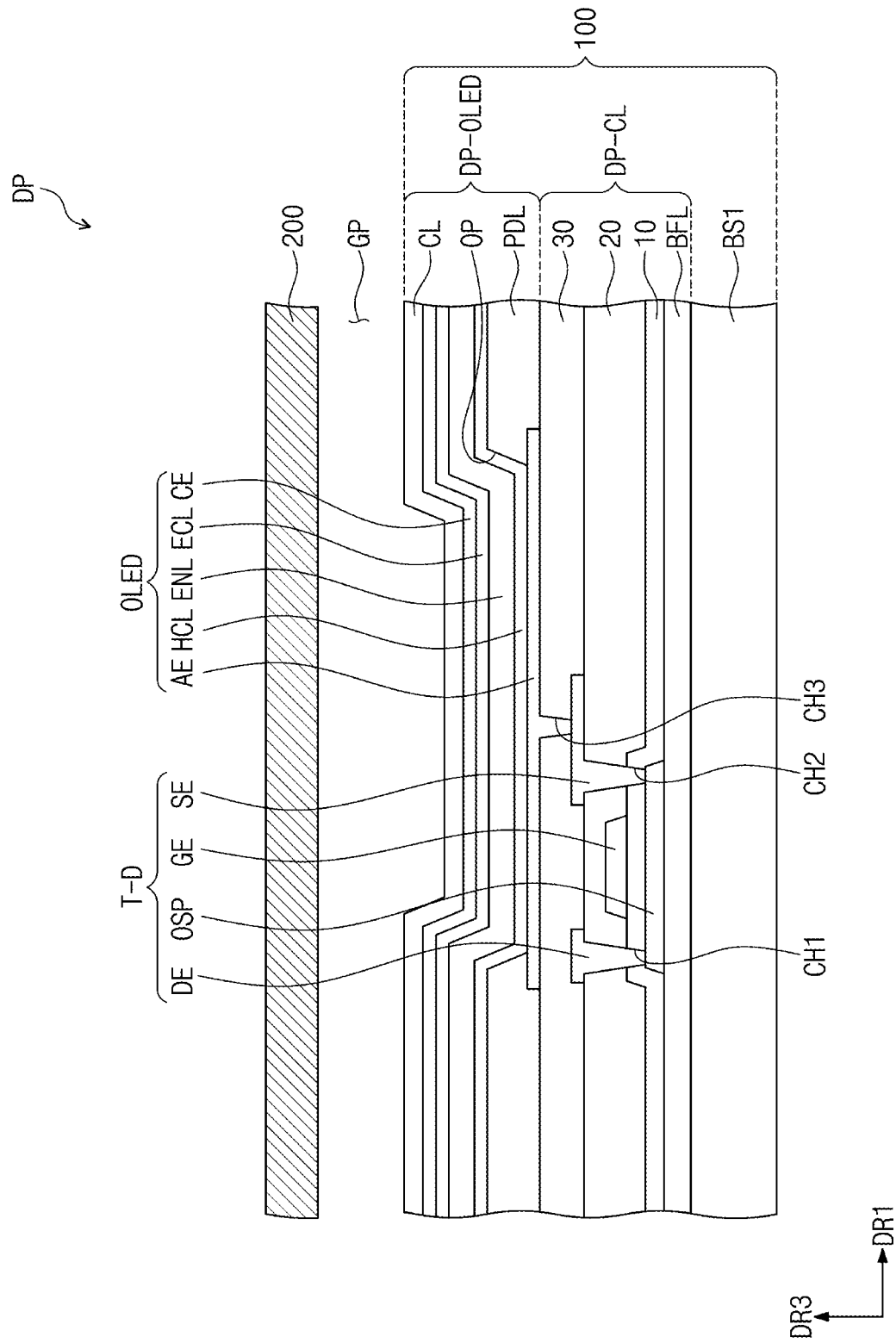
FIG. 4 is a cross-sectional view of an exemplary embodiment of one pixel area of a display panel constructed according to the principles of the invention.

FIG. 2 is a plan view of an exemplary embodiment of the display panel DP constructed according to the principles of the invention. FIG. 3 is a plan view of an exemplary embodiment of pixel areas of the display panel DP according to the principles of the invention. FIG. 4 is a cross-sectional view of an exemplary embodiment of one pixel area of the display panel constructed according to the principles of the invention.

Spatial arrangements of and the relative relationships of signal lines GL1 to GLn and DL1 to DLm and the pixels PX11 to PXnm in a plane are shown. The signal lines GL1 to GLn and DL1 to DLm may include a plurality of gate lines GL1 to GLn and a plurality of data lines DL1 to DLm.

Each of the pixels PX11 to PXnm is connected to a corresponding gate line of the gate lines GL1 to GLn and a corresponding data line of the data lines DL1 to DLm. Each of the pixels PX11 to PXnm may include a pixel driving circuit and a display element. Depending on the configuration of the pixel driving circuit, more types of signal lines may be provided on the display panel DP.

The pixels PX11 to PXnm may be arranged in a matrix form, however, they are not limited thereto or thereby. The pixels PX11 to PXnm may be arranged in a pentile form. As another way, the pixels PX11 to PXnm may be arranged in a diamond form.

A gate driving circuit GDC may be disposed in the non-display area NDA. The gate driving circuit GDC may be integrated in the display panel DP by an oxide silicon gate driver circuit (OSG) process or an amorphous silicon gate driver circuit (ASG) process.

FIG. 3 is an enlarged view illustrating a portion of the display area DA shown in FIG. 1A. The display area DA may include a plurality of pixel columns spaced apart from each other in the first direction DR1. Hereinafter, for the convenience of explanation, the display area DA is described as including first, second, and third pixel columns PXA-G1, PXA-G2, and PXA-G3.

In detail, each of the first, second, and third pixel columns PXA-GC1, PXA-GC2, and PXA-GC3 may include the pixel areas arranged in the second direction DR2. As shown in FIG. 3, the first pixel column PXA-GC1 includes a plurality of first pixel areas arranged in the second direction DR2. As an example, the first pixel areas may emit a first color light to the outside. The second pixel column PXA-GC2 includes a plurality of second pixel areas arranged in the second direction DR2. As an example, the second pixel areas may emit a second color light different from the first color light to the outside. The third pixel column PXA-GC3 includes a plurality of third pixel areas arranged in the second direction DR2. As an example, the third pixel areas may emit a third color light different from the second color light to the outside.

Hereinafter, for the convenience of explanation, the first pixel column PXA-GC1 is described as including two first pixel areas PXA-B1 and PXA-B2, the second pixel column PXA-GC2 is described as including two second pixel areas PXA-G1 and PXA-G2, and the third pixel column PXA-GC3 is described as including two third pixel areas PXA-R1 and PXA-R2. Hereinafter, the first to third pixel areas included in the first to third pixel columns PXA-G1, PXA-G2, and PXA-G3 may be referred to as main pixel areas.

The first pixel areas PXA-B1 and PXA-B2 emit the first color light having a first color wavelength band through the upper display substrate 200. The second pixel areas PXA-G1 and PXA-G2 emit the second color light having a second color wavelength band different from the first color wavelength band through the upper display substrate 200. The third pixel areas PXA-R1 and PXA-R2 emit the third color light having a third color wavelength band different from the first and second color wavelength bands through the upper display substrate 200.

The first pixel areas PXA-B1 and PXA-B2 may provide a blue light, the second pixel areas PXA-G1 and PXA-G2 may provide a green light, and the third pixel areas PXA-R1 and PXA-R2 may provide a red light. In the illustrated exemplary embodiment, a source light may be the blue light corresponding to the first color light. The source light may be generated by a light source such as a backlight unit or a display element such as a light emitting element.

The display area DA further includes a light blocking area NPXA defined adjacent to the main pixel areas. In the this application, the pixel area means an area from which the source light exits to the outside through the upper display substrate 200, and the light blocking area NPXA means an area that blocks the source light from being output to the outside through the upper display substrate 200. The light blocking area NPXA prevents colors from being mixed between the pixel areas. The main pixel areas and the light blocking area NPXA of the display area DA may be defined in the upper display substrate 200 described in FIG. 1B.

The light blocking area NPXA includes a first light blocking area NA1 and a second light blocking area NA2. The first light blocking area NA1 extends in the second direction DR2 and is disposed between the first, second, and third pixel columns PXA-G1, PXA-G2, and PXA-G3. The second light blocking area NA2 is disposed between the pixel areas included in each of the first, second, and third pixel columns PXA-G1, PXA-G2, and PXA-G3. For example, the second light blocking area NA2 is disposed between the two first pixel areas PXA-B1 and PXA-B2.

FIG. 3 illustrates the main pixel areas having substantially the same area in a plan view as a representative example, however, the main pixel areas are not limited thereto or thereby. For example, the first, second, and third pixel areas respectively included in the first, second, and third pixel columns PXA-G1, PXA-G2, and PXA-G3 may have different areas from each other and/or may have a rounded corner area when viewed in plan. In addition, the first, second, and third pixel areas may have different polygonal shapes from each other or a regular polygonal shape whose corner areas are rounded.

FIG. 4 illustrates a cross-sectional view of the display panel DP corresponding to one of the second pixel areas PXA-G1 and PXA-G2. FIG. 4 shows a cross-sectional view corresponding to a driving transistor T-D and a light emitting device OLED. The upper display substrate 200 is simply shown in FIG. 4.

Referring to FIG. 4, the lower display substrate 100 includes a first base substrate BS1, a circuit device layer DP-CL disposed on the first substrate BS1, and a display element layer DP-OLED disposed on the circuit device layer DP-CL.

The first base substrate BS1 may include a synthetic resin substrate or a glass substrate. The circuit device layer DP-CL includes at least one insulating layer and a circuit element. The circuit element includes a signal line and a driving circuit of the pixel. The circuit device layer DP-CL may be formed by coating and deposition processes used to form an insulating layer, a semiconductor layer, and a conductive layer and a photolithography process used to pattern the insulating layer, the semiconductor layer, and the conductive layer.

The circuit device layer DP-CL according to the illustrated exemplary embodiment includes a buffer layer BFL, a first insulating layer 10, a second insulating layer 20, and a third insulating layer 30. Each of the first insulating layer 10 and the second insulating layer 20 may be an inorganic layer, and the third insulating layer 30 may be an organic layer.

FIG. 4 illustrates a spatial arrangement between a semiconductor pattern OSP, a control electrode GE, an input electrode DE, and an output electrode SE, which form the driving transistor T-D, as a representative example. First, second, and third contact holes CH1, CH2, and CH3 are also illustrated by way of example.

The display element layer DP-OLED includes the light emitting device OLED. The light emitting device OLED generates the above-described source light. The light emitting device OLED includes a first electrode, a second electrode, and a light emitting layer interposed between the first and second electrodes. In the illustrated exemplary embodiment, the light emitting device OLED includes an organic light emitting diode. The display element layer DP-OLED includes a pixel definition layer PDL. The pixel definition layer PDL may be an organic layer.

The first electrode AE is disposed on the third insulating layer 30. The first electrode AE is connected to the output electrode SE through the third contact hole CH3 defined through the third insulating layer 30. A light emitting opening OP is defined through the pixel definition layer PDL. At least a portion of the first electrode AE is exposed through the light emitting opening OP of the pixel definition layer PDL. The source light emitted from the light emitting device OLED exits through the light emitting opening OP and is provided to the outside through the pixel area.

A hole control layer HCL, the light emitting layer EML, and an electron control layer ECL may be commonly disposed on the first electrode AE and the pixel definition layer PDL. The hole control layer HCL, the light emitting layer EML, and the electron control layer ECL may be commonly disposed in the above-described main pixel areas.

The hole control layer HCL may include a hole transport layer and may further include a hole injection layer. The light emitting layer EML may generate the blue light. The blue light may have a wavelength from about 410 nm to about 480 nm. A light emission spectrum of the blue light may have a maximum peak within a range from about 440 nm to about 460 nm. The electron control layer ECL may include an electron transport layer and may further include an electron injection layer. The light emitting layer EML may have a tandem structure or a single layer structure.

The electron control layer ECL may be disposed on the second electrode CE. The second electrode CE may be commonly disposed in the main pixel areas. The second electrode CE may have an area larger than the first electrode AE. A cover layer CL may be further disposed on the second electrode CE to protect the second electrode CE. The cover layer CL may include an organic material or an inorganic material. According to embodiments, the cover layer CL may be omitted.

The lower display substrate 100 may include a plurality of display elements corresponding to the main pixel areas shown in FIG. 3. The display elements may have the same stack structure as each other and may have the stack structure shown in FIG. 4.

Figure 5:
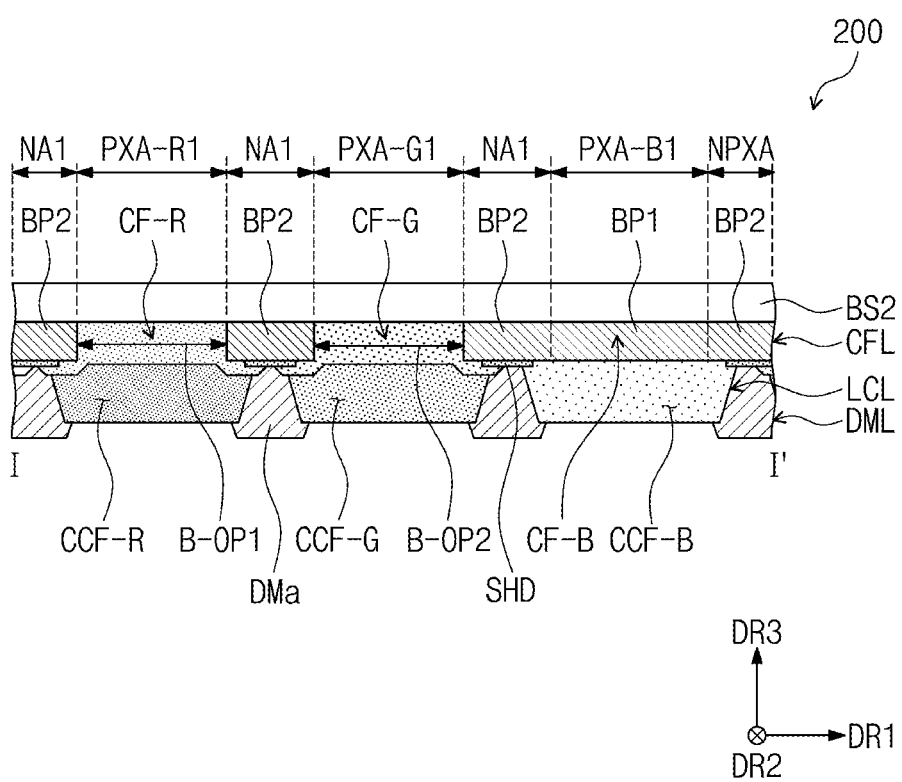
FIG. 5 is a cross-sectional view of an exemplary embodiment of an upper display substrate taken along a line I-I' in FIG. 3.
Figure 6A:
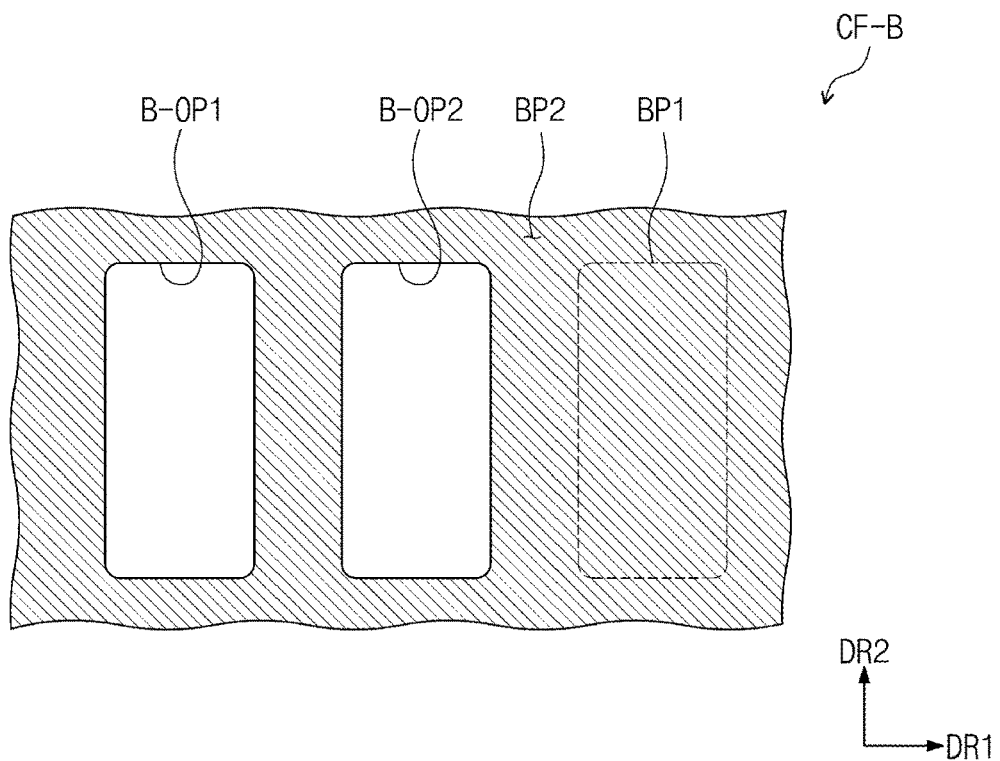
FIG. 6A is a plan view of an exemplary embodiment of stacked structures of the upper display substrate of FIG. 3.
Figure 6B:
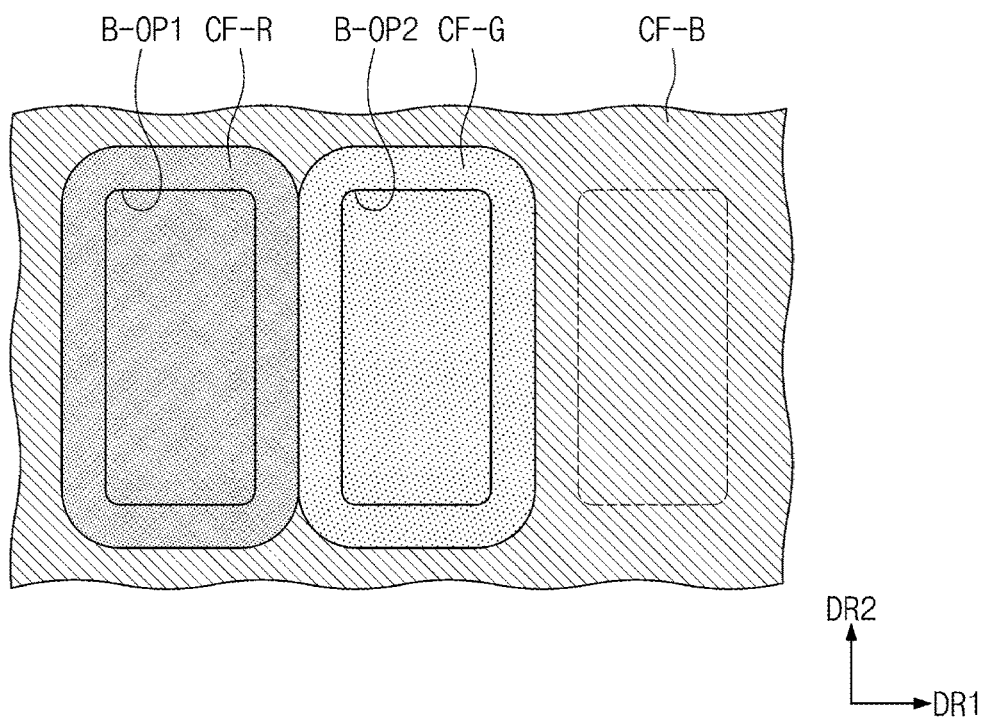
FIG. 6B is a plan view of another exemplary embodiment of stacked structures of the upper display substrate of FIG. 3
Figure 6C:
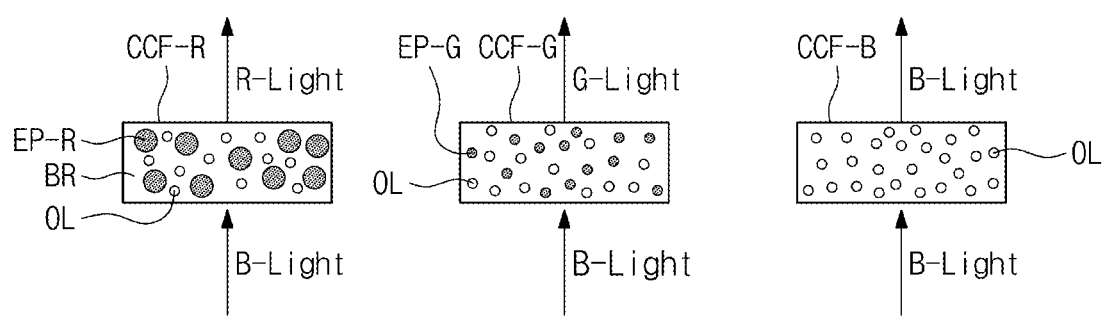
FIG. 6C is a view of an exemplary embodiment illustrating optical characteristics of a light control layer in the display panel of FIG. 3.

FIG. 5 is a cross-sectional view of an exemplary embodiment of the upper display substrate 200 taken along a line I-I' in FIG. 3. FIG. 6A is a plan view of an exemplary embodiment of stacked structures of the upper display substrate 200 on which a first color filter CF-B is formed. FIG. 6B is a plan view of another exemplary embodiment of the stacked structures of the upper display substrate 200 on which all three color filters CF-B, CF-G, and CF-R are formed. FIG. 6C is a view of an exemplary embodiment illustrating optical characteristics of a light control layer in the display panel of FIG. 3.

Referring to FIG. 5, the upper display substrate 200 includes a second base substrate BS2, a color filter layer CFL, a light control layer LCL, and a barrier layer DML.

The color filter layer CFL includes first, second, and third color filters CF-B, CF-G, and CF-R disposed on the second base substrate BS2. According to the exemplary embodiment, the first, second, and third color filters CF-B, CF-G, and CF-R are directly disposed on the second base substrate BS2.

The first color filter CF-B may have a refractive index similar to a refractive index of the second base substrate BS2 rather than the refractive index of the second color filter CF-G and the refractive index of the third color filter CF-R. As a result, an external light from the outside may be incident into the first color filter CF-B after passing through the second base substrate BS2. Accordingly, a reflection of the external light, which occurs at an interface between the second base substrate BS2 and the color filter layer CFL, may be reduced.

In detail, the first color filter CF-B may be divided into a filter portion BP1 that acts as a color filter and a light blocking portion BP2 that acts as a light blocking pattern. The filter portion BP1 may overlap with the first pixel area PXA-B1, and the light blocking portion BP2 may overlap with the light blocking area NPXA. According to FIG. 5, the light blocking portion BP2 may overlap with the second light blocking area NA2 of the light blocking area NPXA.

Referring to FIG. 6A, the first color filter CF-B, through which a first opening B-OP1 and a second opening B-OP2 are defined, may be formed by forming an organic layer having a blue color on one surface of the second base substrate BS2 and by exposing and developing the organic layer. That is, the filter portion BP1 and the light blocking portion BP2 of the first color filter CF-B may be integrally formed.

Referring to FIG. 6B, the second color filter CF-G is disposed in the second opening B-OP2 defined through the first color filter CF-B. When viewed in a plan view, the second color filter CF-G substantially covers the entire second opening B-OP2, and at least a portion of the second color filter CF-G is disposed on the light blocking portion BP2. The third color filter CF-R is disposed in the first opening B-OP1 defined through the first color filter CF-B. When viewed in a plan view, the third color filter CF-R substantially covers the entire first opening B-OP1, and at least a portion of the third color filter CF-R is disposed on the light blocking portion BP2.

The second color filter CF-G and the third color filter CF-R, which are disposed on the light blocking portion BP2, may make contact with each other, however, they are not limited thereto or thereby. That is, the third color filter CF-R disposed on the light blocking portion BP2 may be spaced apart from the second color filter CF-G.

Referring to FIG. 5 again, a light shielding member SHD may be disposed on the light blocking member BP2 of the first color filter CF-B. A portion of the second color filter CF-G and a portion of the third color filter CF-R may be disposed on the light shielding member SHD.

The light shielding member SHD may absorb the external light applied thereto through the light blocking portion BP2 and may prevent color mixture between the first, second, and third pixel areas PXA-B1, PXA-G1, and PXA-R1. In addition, the light shielding member SHD may absorb a portion of the light exiting from the light control layer LCL.

As an example, the light shielding member SHD may be provided as a black light shielding layer. As another example, the light shielding member SHD may be provided as a yellow light shielding layer.

The light control layer LCL may be disposed on the color filter layer CFL and may include a light emitting substance that converts the first color light emitting from the display element layer DP-OLED (refer to FIG. 4) to a different color light.

The light control layer LCL may include a transmission portion CCF-B, a first conversion portion CCF-G, and a second conversion portion CCF-R. The transmission portion CCF-B may overlap with the first pixel area PXA-B1 and may transmit the first color light. The transmission portion CCF-B may be provided in a plural number, and the transmission portions CCF-B may respectively overlap with the first pixel areas PXA-B1 and PXA-B2 illustrated in FIG. 3.

The first conversion portion CCF-G may overlap with the second pixel area PXA-G1 and may absorb the first color light to emit the second color light different from the first color light. The first conversion portion CCF-G may be provided in a plural number, and the first conversion portions CCF-G may respectively overlap with the second pixel areas PXA-G1 and PXA-G2 illustrated in FIG. 3.

The second conversion portion CCF-R may overlap with the third pixel area PXA-R1 and may emit the third color light different from the second color light. The second conversion portion CCF-R may be provided in a plural number, and the second conversion portions CCF-R may respectively overlap with the third pixel areas PXA-R1 and PXA-R2 illustrated in FIG. 3.

Referring to FIG. 6C, the first conversion portion CCF-G may include a first light emitting substance EP-G, and the first light emitting substance EP-G may convert the first color light B-Light to the second color light G-Light that is a green light. The second conversion portion CCF-R may include a second light emitting substance EP-R, and the second light emitting substance EP-R may convert the first color light B-Light to the third color light R-Light that is a red light. The transmission portion CCF-B may not include the light emitting substance. The transmission portion CCF-B may transmit the first color light B-Light.

The transmission portion CCF-B, the first conversion portion CCF-G, and the second conversion portion CCF-R may include a base resin BR. The base resin BR may be a polymer resin. For example, the base resin BR may be an acrylic-based resin, a urethane-based resin, a silicon-based resin, or an epoxy-based resin. The base resin BR may be a transparent resin.

In addition, each of the transmission portion CCF-B, the first conversion portion CCF-G, and the second conversion portion CCF-R may further include scattering particles OL. The scattering particles OL may be TiO2 or silica-based nano-particles. The scattering particles OL may scatter the light emitted from the light emitting substance to discharge the scattered light to the outside of the conversion portions. Further, in the case of the transmission portion CCF-B that transmits the light without modifying the light, the scattering particles OL may discharge the light applied thereto after scattering the light.

The first and second light emitting substances EP-G and EP-R (hereinafter, referred to as "light emitting substances") included in the light control layer LCL may be a fluorescent substance or a quantum dot. That is, the light control layer LCL may include at least one of the fluorescent substance or the quantum dot as the light emitting substances EP-G and EP-R.

As an example, the fluorescent substance used as the light emitting substances EP-G and EP-R may be an inorganic fluorescent substance. In the display panel DP according to the exemplary embodiment, the fluorescent substance used as the light emitting substances EP-G and EP-R may be a green fluorescent substance or a red fluorescent substance.

The type of the fluorescent substance used in the light control layer LCL is not limited to the above-described materials, and a known fluorescent substance other than the above-mentioned fluorescent substance may be used.

As another example, the light emitting substances EP-G and EP-R included in the light control layer LCL may be the quantum dot. The quantum dot may be selected from Group II-VI compounds, Group III-V compounds, Group IV-VI compounds, Group IV elements, Group IV compounds, and combinations thereof.

The quantum dot may have a core-shell structure that includes a core and a shell surrounding the core. In addition, the quantum dot may have a core-shell structure in which one quantum dot surrounds another quantum dot. An interface between the core and the shell may have a concentration gradient in which a concentration of elements existing in the shell becomes lower toward a center of the interface.

The quantum dot may be a particle having a size of nanometer scale. The quantum dot may have a full-width-of-half-maximum (FWHM) of the light emission wavelength spectrum of about 45 nm or less, preferably about 40 nm or less, more preferably about 30 nm or less, and a color purity or a color reproducibility in the above-mentioned range may be improved. In addition, since the light emitted from the quantum dot travels in all directions, a light viewing angle may be improved.

In addition, the quantum dot may have a form that is commonly used in the field and is not particularly limited. For instance, a nano-particle, a nanotube, a nanowire, a nanofiber, or a nanoplate-like particle in a spherical, pyramidal, multi-arm, or cubic form may be used as the form of the quantum dot.

The color of the light emitted from the quantum dot may be changed depending on the size of the quantum dot. In a case where the first light emitting substance EP-G and the second light emitting substance EP-R are the quantum dot, the particle sizes of the first light emitting substance EP-G and the second light emitting substance EP-R may be different from each other. For example, the particle size of the first light emitting substance EP-G may be smaller than the particle size of the second light emitting substance EP-R. In this case, the first light emitting substance EP-G may emit the light with a wavelength longer than that of the second light emitting substance EP-R.

Figure 7:
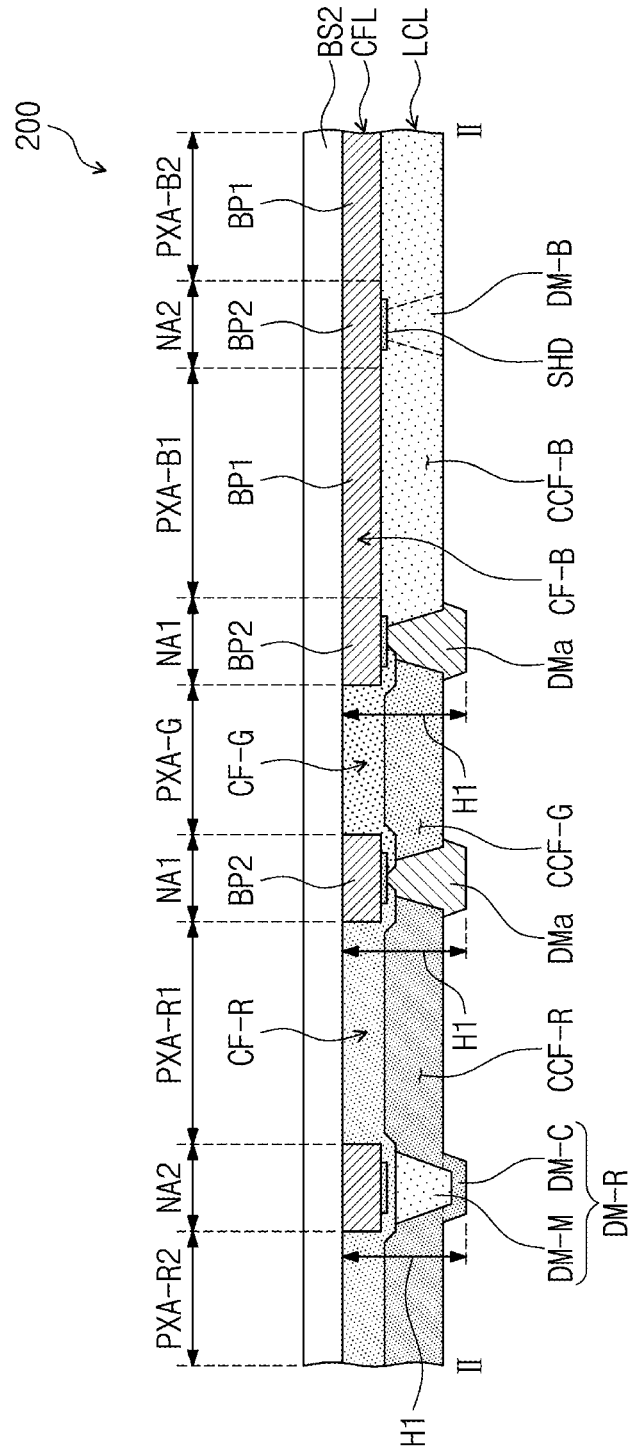
FIG. 7 is a cross-sectional view of an exemplary embodiment of an upper display substrate taken along a line II-IF in FIG. 3.

Referring to FIG. 5 again, the barrier layer DML may overlap with the light blocking area NPXA and may be disposed on the light blocking portion BP2 of the color filter layer CFL. The barrier layer DML may have a shape extending in the second direction DR2 and may include first barriers DMa disposed between and overlapping portions of the transmission portion CCF-B and the first conversion portion CCF-G and also disposed between and overlapping portions of the first conversion portion CCF-G and the second conversion portion CCF-R. In addition, as shown in FIG. 7, the barrier layer DML may include second sub-barriers DM-R disposed between and overlapping portions of a plurality of second conversion portions CCF-R, and third sub-barriers DM-B disposed between and overlapping portions of a plurality of transmission portions CCF-B. Further, the barrier layer DML may also include first sub-barriers disposed between and overlapping portions of a plurality of first conversion portions CCF-G, which have substantially the same structure as the second sub-barriers DM-R.

The first barriers DMa may overlap with the first light blocking area NA1 (refer to FIG. 3) of the light blocking area NPXA, and the first to third sub-barriers may overlap with the second light blocking area NA2 (refer to FIG. 3) of the light blocking area NPXA.

The first barriers DMa and the first to third sub-barriers may be formed by different processes from each other and may include different materials from each other. These will be described in detail later.

The first barriers DMa may have a color having a wavelength range different from that of the first color of the blue light and may be disposed on the light blocking portion BP2 of the color filter layer CFL. As an example, the first barriers DMa may have a black color. The first barriers DMa may prevent the color mixture from occurring between the first, second, and third pixel areas PXA-B1, PXA-G1, and PXA-R1 spaced apart from each other in the first direction DR1.

Referring to FIG. 5, at least a portion of each of the first barriers DMa may be exposed without being covered by the light control layer LCL. That is, the portion of each of the first barriers DMa may have a shape protruding from a lower surface of the light control layer LCL. In the illustrated exemplary embodiment, the lower surface of the light control layer LCL is a surface facing the lower display substrate 100. For example, the lower surface of the light control layer LCL is a lower surface of each of the transmission portion CCF-B, the first conversion portion CCF-G, and the second conversion portion CCF-R.

FIG. 7 is a cross-sectional view of an exemplary embodiment of an upper display substrate taken along a line II-IF in FIG. 3.

FIG. 7 illustrates a second sub-barrier DM-R and a third sub-barrier DM-B of the first, second, and third sub-barriers overlapping the above-mentioned second light blocking area NA2. The first sub-barrier may have substantially the same structure as the second sub-barrier DM-R.

Referring to FIGS. 3 and 7, the second sub-barrier DM-R may include a barrier portion DM-M disposed on the third color filter CF-R and a cover portion DM-C covering the barrier portion DM-M and connected to the second conversion portion CCF-R. As described above, the sub-barriers may be disposed on the color filter layer CFL rather than the light control layer LCL. As an example, the sub-barriers may be directly disposed on the color filter layer CFL.

Accordingly, each of a plurality of the second sub-barriers DM-R disposed between the second conversion portions CCF-R may include the barrier portion DM-M and the cover portion DM-C. Further, a plurality of first sub-barriers disposed between the first conversion portions CCF-G may have substantially the same structure as the second sub-barrier DM-R that includes the barrier portion DM-M and the cover portion DM-C.

The barrier portion DM-M may be disposed between the second conversion portions CCF-R to prevent the color mixture from occurring between adjacent second conversion portions CCF-R. The cover portion DM-C may entirely cover the barrier portion DM-M and may be connected to the lower surface of the second conversion portions CCF-R. The cover portion DM-C may have a shape protruding from an upper surface of the second conversion portions CCF-R and may include the same material as the second conversion portions CCF-R. As an example, the cover portion DM-C and the second conversion portions CCF-R may be integrally formed in the same process.

The portion of the first barrier DMa protruding from the light control layer LCL described with reference to FIG. 5 may have substantially the same height as a height of the cover member DM-C.

The second sub-barrier DM-R includes the barrier portion DM-M and the cover portion DM-C, however, the second sub-barrier DM-R may include only the barrier portion DM-M. In this case, the cover portion DM-C may be provided as a portion of the second conversion portions CCF-R, and the second sub-barrier DM-R may be entirely covered by the second conversion portion CCF-R.

Hereinafter, the distance from a lower surface of the second base substrate BS2 to the lower surface of the first barrier DMa facing the lower display substrate 100 is referred to as the "first shortest distance". The distance from the lower surface of the second base substrate BS2 to the lower surface of the second sub-barrier DM-R facing the lower display substrate 100 is referred to as the "second shortest distance". In the exemplary embodiment shown in FIG. 7, the lower surface of the second sub-barrier DM-R means the lower surface of the cover portion DM-C.

In a conventional display panel, since the first shortest distance is different from the second shortest distance, the lower surface of the barrier DMa and the lower surface of the sub-barrier MD-R are not located in the same horizontal plane, and there is a partial height difference therebetween. Accordingly, color mixture occurs between pixel areas.

However, according to the principles of the invention, the first shortest distance and the second shortest distance may have substantially the same length H1. As the first shortest distance and the second shortest distance have substantially the same length H1, the color mixture between the pixel areas may be effectively prevented from occurring. The shortest distance from the lower surface of the second substrate BS2 to the lower surface of the first sub-barrier facing the lower display substrate 100 may be equal to the length H1 corresponding to the second shortest length.

In addition, even though the first shortest distance from the second base substrate BS2 to the lower surface of the first barrier DMa and the second shortest distance from the second base substrate BS2 to the lower surface of the second sub-barrier DM-R are designed to be equal to each other, the first shortest distance and the second shortest distance may be slightly different due to errors in the manufacturing process. For instance, the first shortest distance may be slightly longer than the second shortest distance due to the manufacturing process, and vice versa. Accordingly, even though there is a slight difference between the first shortest distance and the second shortest distance due to manufacturing tolerances or the like, the first and second shortest distances are considered to be substantially the same as each other.

The third sub-barrier DM-B may have a structure different from that of the second sub-barrier DM-R. That is, the third sub-barrier DM-B may be provided in an integral form with the transmission portion CCF-B. The transmission portions CCF-B respectively overlapping the first pixel areas PXA-B included in the first pixel column PXA-GC1 (refer to FIG. 3) and the third sub-barriers DM-B disposed between the transmission portions CCF-B may be provided substantially as one component extending in the second direction DR2.

In particular, as the third sub-barrier DM-B and the transmission portions CCF-B are provided as one component, the shortest distance from the second base substrate BS2 to the lower surface of the third sub-barrier DM-B facing the lower display substrate 100 may be shorter than the second shortest distance.

In addition, the barrier portion DM-M of the second sub-barrier DM-R may include the same material as the transmission portion CCF-B. The barrier portion DM-M of the second sub-barrier DM-R may have a transparent color and may be formed through the same process as the transmission portion CCF-B.

Further, the barrier portion DM-M of the second sub-barrier DM-R may include the scattering particles OL shown in FIG. 6C. The scattering particles OL included in the barrier portion DM-M may scatter the light incident thereto from the outside to change a traveling direction of the light. As a result, the barrier portion DM-M may have a function that prevents the color mixture using the scattering particles OL.

Figure 8:
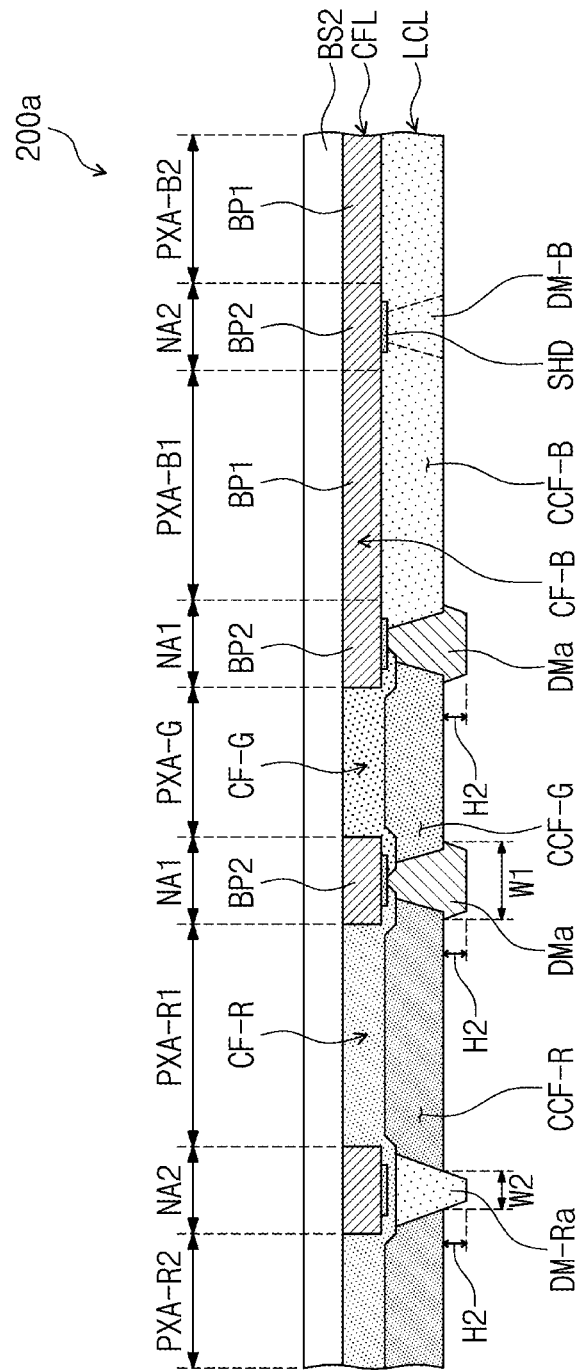
FIG. 8 is a cross-sectional view of another exemplary embodiment of an upper display substrate taken along a line II-IF in FIG. 3.

FIG. 8 is a cross-sectional view of another exemplary embodiment of an upper display substrate taken along a line II-IF in FIG. 3.

An upper display substrate 200a shown in FIG. 8 may have substantially the same structure as the upper display substrate 200 shown in FIG. 7 except that a structure of a second sub-barrier is changed. Accordingly, for the convenience of explanation, descriptions of the same configurations as those in FIG. 7 will be omitted to avoid redundancy.

Referring to FIG. 8, at least a portion of a second sub-barrier DM-Ra may protrude outwardly from a second conversion portion CCF-R of a light control layer LCL to face the lower display substrate 100. That is, the second sub-barrier DM-Ra shown in FIG. 8 may include only a barrier portion and may not include the cover portion when compared with the second sub-barrier DM-R illustrated in FIG. 7.

In detail, a height H2 of a portion of a first barrier DMa protruding from the light control layer LCL may be substantially the same as a height H2 of a portion of the second sub-barrier DM-Ra protruding from the second conversion portion CCF-R. That is, each of the height H2 of the portion of the first barrier DMa and the height H2 of the portion of the second sub-barrier DM-Ra may be a height from a lower surface of the light control layer LCL. In addition, the lower surface of the light control layer LCL may have a substantially uniform height from the second base substrate BS2.

Further, an area W1 of the portion of the first barrier DMa may be larger than an area W2 of the portion of the second sub-barrier DM-Ra when viewed in a plan view. That is, the area of the portion of the first barrier DMa exposed without being covered by the lower surface of the light control layer LCL may be larger than the area of the portion of the second sub-barrier DM-Ra exposed without being covered by the lower surface of the light control layer LCL when viewed in a plan view.

Figure 9A:
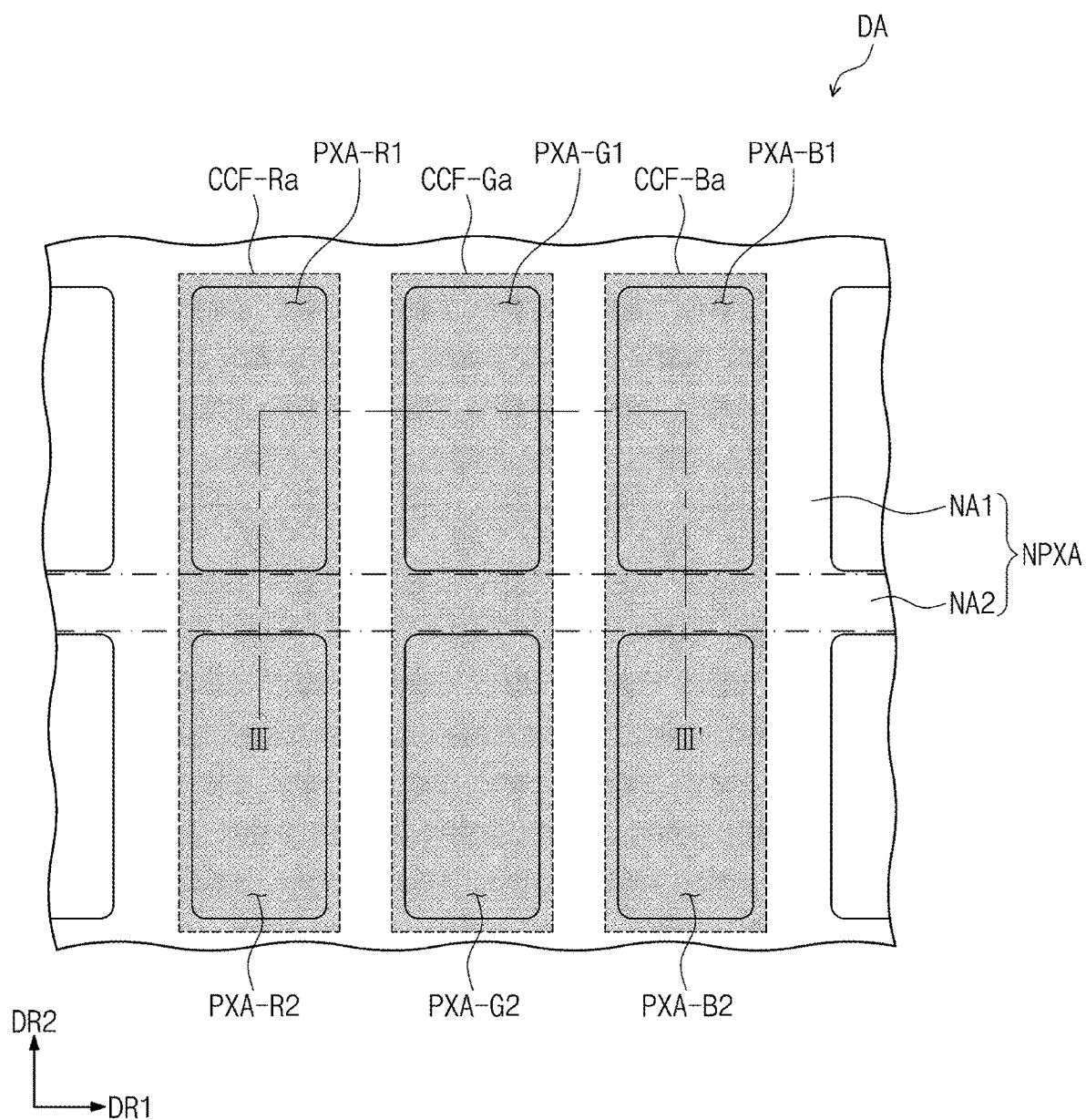
FIG. 9A is a plan view of another exemplary embodiment of representative pixel areas of a display panel constructed according to the principles of the invention.
Figure 9B:
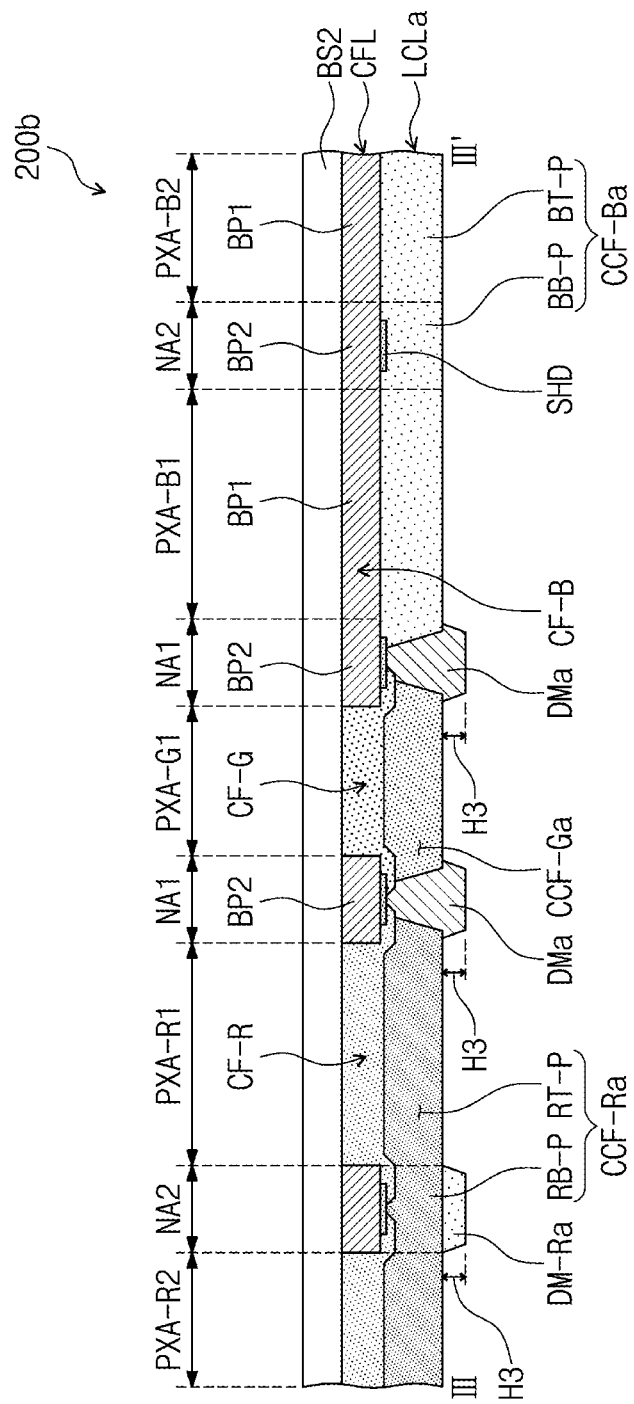
FIG. 9B is a cross-sectional view of an exemplary embodiment of an upper display substrate taken along a line in FIG. 9A.

FIG. 9A is a plan view of another exemplary embodiment of representative pixel areas of a display panel constructed according to the principles of the invention. FIG. 9B is a cross-sectional view of an exemplary embodiment of an upper display substrate taken along a line in FIG. 9A.

An upper display substrate 200b shown in FIGS. 9A and 9B may have substantially the same structure as the upper display substrate 200 shown in FIG. 7 except that the structure of the light control layer LCL and the barrier layer DML is changed. Accordingly, for the convenience of explanation, descriptions of the same configurations as those in FIG. 7 will be omitted to avoid redundancy.

Referring to FIGS. 9A and 9B, a light control layer LCLa may include a transmission portion CCF-Ba, a first conversion portion CCF-Ga, and a second conversion portion CCF-Ra.

The transmission portion CCF-Ba may overlap with first pixel areas PXA-B1, PXA-B2 and second light blocking areas NA2 disposed between the first pixel areas PXA-B1, PXA-B2. That is, the transmission portion CCF-Ba may be provided as one component extending in the second direction DR2. The transmission portion CCF-Ba may include transmission portions BT-P overlapping the first pixel areas PXA-B1, PXA-B2 and light blocking portions BB-P overlapping the second light blocking areas NA2. The light blocking portions BB-P of the transmission portion CCF-Ba may overlap with light blocking portions BP2 of a first color filter CF-B.

The first conversion portion CCF-Ga may overlap with second pixel areas PXA-G1, PXA-G2 and second light blocking areas NA2 disposed between the second pixel areas PXA-G1, PXA-G2. That is, the first conversion portion CCF-Ga may be provided as one component extending in the second direction DR2. The first conversion portion CCF-Ga may include transmission portions overlapping the second pixel areas PXA-G1, PXA-G2 and light blocking portions overlapping the second light blocking areas NA2. The light blocking portions of the first conversion portion CCF-Ga may overlap with the light blocking portions BP2 of the first color filter CF-B.

The second conversion portion CCF-Ra may overlap with third pixel areas PXA-R1, PXA-R2 and second light blocking areas NA2 disposed between the third pixel areas PXA-R1, PXA-R2. That is, the second conversion portion CCF-Ra may be provided as one component extending in the second direction DR2. The second conversion portion CCF-Ra may include transmission portions RT-P overlapping the third pixel areas PXA-R1, PXA-R2 and light blocking portions RB-P overlapping the second light blocking areas NA2. The light blocking portions RB-P of the second conversion portion CCF-Ra may overlap with the light blocking portions BP2 of the first color filter CF-B.

The barrier layer DML may include first barriers DMa and first to third sub-barriers. The first barriers DMa may have a shape extending in the second direction DR2 and may overlap between the transmission portion CCF-Ba and the first conversion portion CCF-Ga and between the first conversion portion CCF-Ga and the second conversion portion CCF-Ra. The structure of the first barriers DMa may be substantially the same as that of the first barriers DMa shown in FIG. 5.

The second sub-barrier DM-Ra may be disposed on the light blocking portion RB-P of the second conversion portion CCF-Ra. That is, the second sub-barrier DM-Ra shown in FIG. 9B may be disposed on the light control layer LCLa rather than the color filter layer CFL when compared with the second sub-barrier DM-Ra shown in FIG. 7.

In addition, a height H3 of a portion of the first barrier DMa protruding from the light control layer LCLa may be substantially the same as a height H3 of a portion of the second sub-barrier DM-Ra disposed on the light blocking portion RB-P of the second conversion portion CCF-Ra. Each of the heights H3 of the portion of the first barrier DMa and the heights H3 of the portion of the second sub-barrier DM-Ra is a height defined from a lower surface of the light control layer LCLa.

The second sub-barrier DM-Ra may include the same material as the first barrier DMa. That is, the second sub-barrier DM-Ra and the first barrier DMa may have the same color as each other, however, they are not limited thereto or thereby. The second sub-barrier DM-Ra may include the same material as the transmission portion CCF-Ba and may have the color having the wavelength range different from that of the first color.

FIGS. 10A to 10E are cross-sectional views sequentially illustrating some steps in a exemplary method for manufacturing a display panel shown in FIG. 7.

Figure 10A:
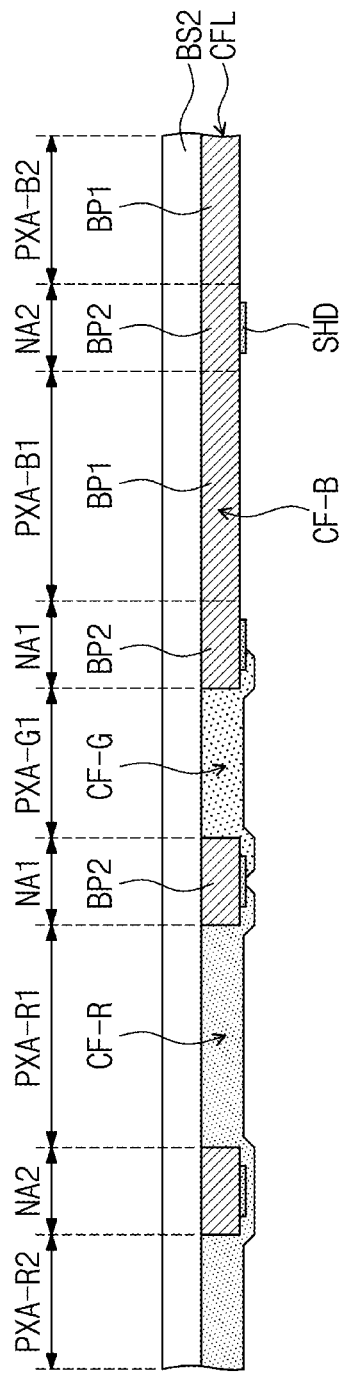
FIGS. 10A to 10E are cross-sectional views sequentially illustrating some steps in a exemplary method for manufacturing a display panel shown in FIG. 7.

Referring to FIG. 10A, the color filter layer CFL may be disposed on the second base substrate BS2. The color filter layer CFL may have substantially the same structure as that of the color filter layer CFL described with reference to FIG. 5.

Figure 10B:
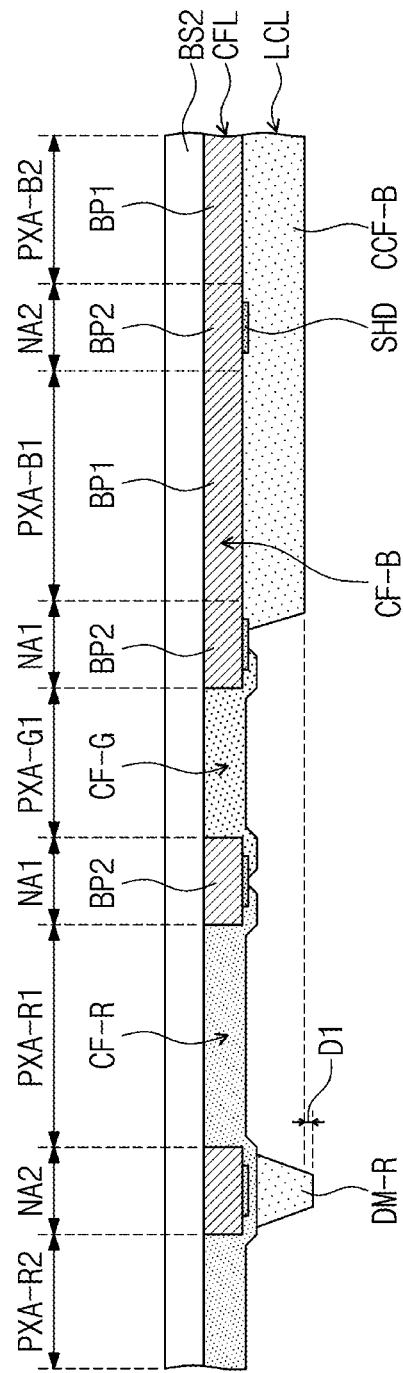

Referring to FIG. 10B, the second sub-barrier DM-R and the transmission portion CCF-B may be formed on the color filer layer CFL. The first sub-barrier disposed between the first conversion portions CCF-G may be substantially simultaneously formed with the second sub-barrier. As described above, the second sub-barrier DM-R and the transmission portion CCF-B may be disposed on the color filter layer CFL with the same material. The second sub-barrier DM-R and the transmission portion CCF-B may be formed by forming a transparent resin layer including the scattering particles OL (refer to FIG. 6C) on the color filter layer CFL and by performing an exposure and development process on the transparent resin layer.

In this case, the length from the second base substrate BS2 to the lower surface of the second sub-barrier DM-R may be larger than the length from the second base substrate BS2 to the lower surface of the transmission portion CCF-B by a predetermined length D1. As an example, the predetermined length D1 may correspond to a thickness of the third color filter CF-R disposed on the light blocking portion BP2 of the first color filter CF-B.

Figure 10C:
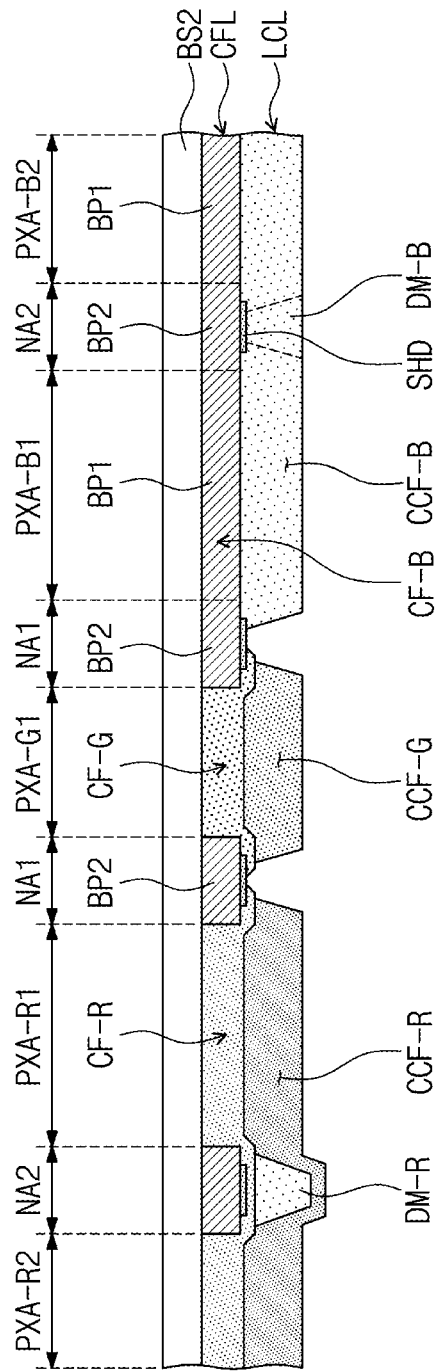

Referring to FIG. 10C, the first conversion portion CCF-G and the second conversion portion CCF-R of the light control layer LCL may be formed on the color filter layer CFL. In detail, the first conversion portion CCF-G and the second conversion portion CCF-R may be sequentially formed on the color filter layer CFL through different processes from each other. For example, the first conversion portion CCF-G may be formed by forming the resin layer including the first light emitting substance EP-G (refer to FIG. 6C) on the color filter layer CFL and by performing an exposure and development process on the resin layer. Then, the second conversion portion CCF-R may be formed by forming the resin layer including the second light emitting substance EP-R (refer to FIG. 6C) on the color filter layer CFL and by performing an exposure and development process on the resin layer. However, the process sequence of the first conversion portion CCF-G and the second conversion portion CCF-R may be changed with respect to each other.

According to FIG. 10C, the second conversion portion CCF-R formed on the color filter layer CFL may substantially cover the entire second sub-barrier DM-R.

Figure 10D:
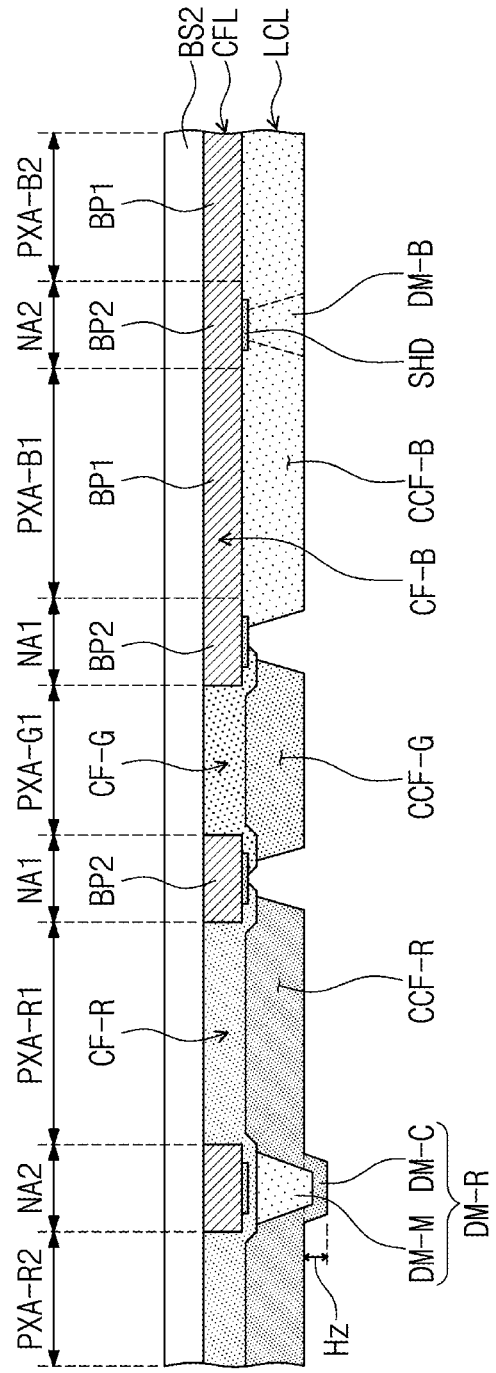

Referring to FIG. 10D, the portion of the second conversion portion CCF-R overlapping the second sub-barrier DM-R may correspond to the cover portion DM-C of the second sub-barrier DM-R described with reference to FIG. 7. The cover portion DM-C of the second sub-barrier DM-R may protrude from the lower surface of the second conversion portion CCF-R that does not overlap with the second sub-barrier DM-R by a predetermined height Hz.

The height Hz may be determined before forming the first barrier DMa.

Figure 10E:
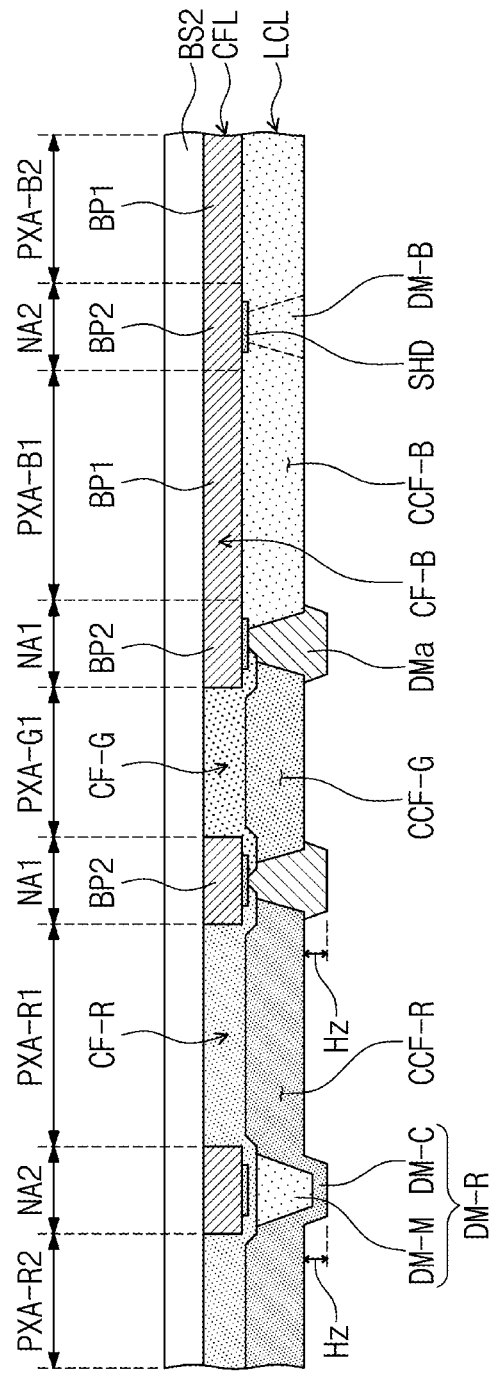

Referring to FIG. 10E, the first barrier DMa may be formed on the color filter layer CFL that overlaps with the first light blocking area NA1 in consideration of the predetermined height Hz of the cover portion DM-C. As a result, the height of the first barrier DMa protruding from the lower surface of the light control layer LCL may correspond to the predetermined height Hz.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
an upper display substrate including a plurality of pixel areas arranged in each of a plurality of pixel columns and a light blocking area disposed adjacent to the pixel areas; and
a lower display substrate comprising a plurality of display elements respectively overlapping the pixel areas,
wherein the upper display substrate comprises:
a base substrate;
a color filter layer disposed on the base substrate; and
a light control layer disposed on the color filter layer and including transmission portions respectively at least partially overlapping first pixel areas arranged in a first one of the pixel columns and first conversion portions respectively at least partially overlapping second pixel areas arranged in a second one of the pixel columns;
wherein the light blocking area includes a first light blocking area defined between the transmission portion and the first conversion portion, and a second light blocking area defined between the first conversion portions, and
wherein a first shortest distance from the base substrate to a lower surface of a first portion of the light control layer overlapping the first light blocking area is substantially equal to a second shortest distance from the base substrate to a lower surface of a second portion of the light control layer overlapping the second light blocking area.

2. The display panel of claim 1, wherein at least one of the first portion and the second portion, and the transmission portions comprise substantially the same material.

3. The display panel of claim 1, wherein at least one of the first portion and the second portion comprises scattering particles and is transparent.

4. The display panel of claim 1, wherein the light control layer further comprises second conversion portions respectively at least partially overlapping third pixel areas arranged in a third one of the pixel columns.

5. The display panel of claim 4, wherein the light blocking area further comprises a third light blocking area defined between the first conversion portion and the second conversion portion, and
a shortest distance from the base substrate to a lower surface of a third portion of the light control layer overlapping the third light blocking area is substantially equal to the second shortest distance.

6. The display panel of claim 1, wherein the light blocking area further comprises a fourth light blocking area defined between the transmission portions, and
a shortest distance from the base substrate to a lower surface of a fourth portion of the light control layer overlapping the fourth light blocking area is shorter than the second shortest distance.

7. A display panel comprising:
a base substrate comprising a plurality of pixel areas arranged in each of a plurality of pixel columns and a light blocking area disposed adjacent to the pixel areas;
a plurality of display elements respectively overlapping the pixel areas;
a light control layer disposed on the plurality of display elements and including transmission portions respectively at least partially overlapping first pixel areas arranged in a first one of the pixel columns and first conversion portions respectively at least partially overlapping second pixel areas arranged in a second one of the pixel columns; and
a color filter layer disposed on the light control layer;
wherein the light blocking area includes a first light blocking area defined between the transmission portion and the first conversion portion, and a second light blocking area defined between the first conversion portions, wherein a thickness of a first portion of the light control layer overlapping the first light blocking area is substantially equal to a thickness of a second portion of the light control layer overlapping the second light blocking area, and a thickness of a first color filter portion of the color filter layer overlapping the first light blocking area is substantially equal to a thickness of a second color filter portion of the color filter layer overlapping the second light blocking area.

* * * * *